(12) United States Patent
Pohl-Klein et al.

(10) Patent No.: US 9,534,169 B2
(45) Date of Patent: Jan. 3, 2017

(54) METHOD FOR PRODUCING A POWDERY PRECURSOR MATERIAL, POWDERY PRECURSOR MATERIAL AND USE THEREOF

(71) Applicant: OSRAM Opto Semiconductors GmbH, Regensburg (DE)

(72) Inventors: Bianca Pohl-Klein, Gilching (DE); Juliane Kechele, Stadtbergen (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/888,038

(22) PCT Filed: Apr. 17, 2014

(86) PCT No.: PCT/EP2014/057957
§ 371 (c)(1),
(2) Date: Oct. 29, 2015

(87) PCT Pub. No.: WO2014/187624
PCT Pub. Date: Nov. 27, 2014

(65) Prior Publication Data
US 2016/0060517 A1 Mar. 3, 2016

(30) Foreign Application Priority Data
May 23, 2013 (DE) .................. 10 2013 105 304

(51) Int. Cl.
C04B 35/581 (2006.01)
C04B 35/584 (2006.01)
C09K 11/08 (2006.01)
C09K 11/77 (2006.01)
H01L 33/50 (2010.01)
H01J 31/00 (2006.01)

(52) U.S. Cl.
CPC ......... C09K 11/7734 (2013.01); C04B 35/581 (2013.01); C04B 35/584 (2013.01); C09K 11/0883 (2013.01); H01L 33/502 (2013.01); C04B 2235/3224 (2013.01); C04B 2235/5409 (2013.01); H01L 2224/48091 (2013.01); H01L 2224/48247 (2013.01); H01L 2224/73265 (2013.01)

(58) Field of Classification Search
CPC C09K 11/676; C09K 11/7706; C09K 11/7734
See application file for complete search history.

(56) References Cited

U.S. PATENT DOCUMENTS

| 4,778,778 | A | * | 10/1988 | Mallia | C04B 35/64 264/676 |
| 6,410,471 | B2 | * | 6/2002 | Kaneyoshi | 264/109 |
| 7,138,756 | B2 | * | 11/2006 | Gotoh | C04B 35/581 252/301.6 F |
| 7,504,349 | B2 | * | 3/2009 | Brown | C03C 3/064 252/512 |
| 7,557,054 | B2 | * | 7/2009 | Oda | C04B 35/563 501/87 |
| 7,803,221 | B2 | * | 9/2010 | Magdassi | B41J 3/28 106/31.6 |
| 8,093,798 | B2 | | 1/2012 | Becker et al. | |
| 8,178,001 | B2 | * | 5/2012 | Kaneda | C01B 33/20 252/301.4 F |
| 8,460,579 | B2 | | 6/2013 | Becker et al. | |
| 9,062,252 | B2 | | 6/2015 | Hirosaki et al. | |
| 2006/0290269 | A1 | | 12/2006 | Fukuda et al. | |
| 2008/0128726 | A1 | | 6/2008 | Sakata et al. | |
| 2009/0322990 | A1 | * | 12/2009 | Kawana | G02F 1/133617 349/68 |
| 2010/0301739 | A1 | * | 12/2010 | Nakamura | B82Y 30/00 313/503 |
| 2011/0135928 | A1 | | 6/2011 | Ravilisetty et al. | |
| 2014/0197362 | A1 | | 7/2014 | Sakata et al. | |

FOREIGN PATENT DOCUMENTS

| CN | 1683470 | A | 10/2005 |
| CN | 1872948 | A | 12/2006 |
| CN | 101090953 | A | 12/2007 |
| CN | 102036999 | A | 4/2011 |
| CN | 102099436 | A | 6/2011 |
| EP | 1568753 | A2 | 8/2005 |
| EP | 2022834 | A1 | 2/2009 |
| EP | 2135919 | A1 | 12/2009 |
| WO | 2007052200 | A1 | 5/2007 |
| WO | 2009117148 | A2 | 9/2009 |
| WO | 2013069696 | A1 | 5/2013 |

OTHER PUBLICATIONS

High Purity Silicon Nitride Powder, Ube Industries, Ltd. pp. 1-3, no date.*
"High-Purity Silicon Nitride Powder," UBE America Inc., Ceramics for Advanced Technology, Sep. 2009, 2 pages.

* cited by examiner

Primary Examiner — Carol M Koslow
(74) Attorney, Agent, or Firm — Slater Matsil, LLP

(57) ABSTRACT

A method can be used for producing a powdery precursor material of the following general composition I or II or III or IV: I: $(Ca_ySr_{1-y})AlSiN_3:X1$ II:$(Ca_bSr_aLi_{1-a-b})AlSi(N_{1-c}F_c)_3:X2$ III: $Z_{5-\delta}Al_{4-2\delta}Si_{8+2\delta}N_{18}:X3$ IV: $(Z_{i-d}Li_d)_{5-\delta}Al_{4-2\delta}Si_{8+2\delta}(N_{1-x}F_x)_{18}:X4$. The method includes A) producing a powdery mixture of starting materials, wherein the starting materials comprise ions of the aforementioned compositions I and/or II and/or III and/or IV, B) annealing the mixture under a protective gas atmosphere, subsequent milling. In method step A), at least one silicon nitride having a specific area of greater than or equal to 5 m$^2$/g and smaller than or equal to 100 m$^2$/g is selected as starting material. The annealing in method step B) is carried out at a temperature of less than or equal to 1550° C.

12 Claims, 1 Drawing Sheet

METHOD FOR PRODUCING A POWDERY PRECURSOR MATERIAL, POWDERY PRECURSOR MATERIAL AND USE THEREOF

This patent application is a national phase filing under section 371 of PCT/EP2014/057957, filed Apr. 17, 2014, which claims the priority of German patent application 10 2013 105 304.1, filed May 23, 2013, each of which is incorporated herein by reference in its entirety.

TECHNICAL FIELD

The invention relates to a process for producing a pulverulent precursor material, to a pulverulent precursor material and to the use of the pulverulent precursor material in an optoelectronic component.

BACKGROUND

In optoelectronic components, for example, light-emitting diodes (LEDs), ceramic materials or ceramic luminophores are used, which convert radiation emitted by a radiation source at a first wavelength to a radiation having a second wavelength. One feature of the ceramic materials is a high thermal durability because of their good removal of heat. A ceramic preliminary material or luminophore precursor material or precursor material requires a small particle size for a high sintering capacity, in order to be able to subject it easily to ceramic processes such as tape casting or spark plasma sintering (SPS).

SUMMARY

Embodiments of the invention specify an improved process for producing a pulverulent precursor material. Further embodiments specify a pulverulent precursor material and the use thereof.

According to at least one embodiment, a process for producing a pulverulent precursor material is specified, which has the following general compositions I and/or II and/or III and/or IV:

I: $(Ca_ySr_{1-y})AlSiN_3{:}X1$
II: $(Ca_bSr_dLi_{1-a-b})AlSi(N_{1-c}F_c)_3{:}X2$
III: $Z_{5-\delta}Al_{4-2\delta}Si_{8+2\delta}N_{18}{:}X3$
IV: $(Z_{1-d}Li_d)_{5-\delta}Al_{4-2\delta}Si_{8+2\delta}(N_{1-x}F_x)_{18}{:}X4$ In these compositions, X1 and X2 and X3 and X4 are each one activator or a combination of two or more activators selected from the group of the lanthanoids, $Mn^{2+}$ and/or $Mn^{4+}$, wherein Z is selected from the following group and combinations thereof: Ca, Sr, Mg, wherein: $0 \leq y \leq 1$ and $0 \leq a < 1$ and $0 \leq b < 1$ and $0 < c \leq 1$ and $|\delta| \leq 0.5$ and $0 \leq x < 1$ and $0 \leq d < 1$.

The process has the following process steps:

A) producing a pulverulent mixture of reactants, wherein the reactants comprise ions of the abovementioned composition I and/or II and/or III and/or IV, B) calcining the mixture under a protective gas atmosphere, then grinding, wherein at least one silicon nitride having a specific surface area of greater or equal than 5 m²/g and less or equal than 100 m²/g is selected as reactant in process step A), wherein the calcining in process step B) is conducted at a temperature of less or equal than 1550° C.

X1 and/or X2 and/or X3 and/or X4 act here as activators or dopants. The activator can be incorporated here into the crystal lattice of the cations of the pulverulent precursor material of the abovementioned general composition I or II or III or IV. The activator may include one or more elements from the group of the lanthanoids. Alternatively or additionally, the activator may be divalent manganese ($Mn^{2+}$) and/or tetravalent manganese ($Mn^{4+}$). The activator may be selected from a group comprising lanthanum, cerium, praseodymium, neodymium, promethium, samarium, europium, gadolinium, terbium, dysprosium, holmium, erbium, thulium, ytterbium and lutetium. More particularly, the activator is europium, cerium and/or lanthanum. In the case of use of trivalent elements as activator, for example, $Ce^{3+}$, there is no charge neutrality. Therefore, charge compensation is generally necessary. The concentration of the activator in the pulverulent precursor material may be 0.01 to 20 mol % or 0.1 mol % to 20 mol %, especially 0.01 to 5 mol %, for example, 0.5 mol %.

A protective gas atmosphere may be understood, for example, to mean an inert or reducing atmosphere. A reducing atmosphere does not rule out the presence of oxygen in this reducing atmosphere.

$|\delta| \leq 0.5$ may be understood to mean the range of $-0.5 \leq \delta \leq 0.5$.

The calcined mixture, after grinding, may yet be sieved if required.

The abovementioned process can be used to produce particularly finely distributed pulverulent precursor materials. Through the choice of suitable synthesis parameters and reactants, it is possible to influence the particle size or the grain size or the grain size value of the resulting pulverulent precursor material. In this context, a particular role is played by the reactivity of the reactants, for example, of the nitrides used.

In process step A), in one embodiment, the nitride selected or used may be silicon nitride ($Si_3N_4$) and/or aluminum nitride (AlN) and/or calcium nitride ($Ca_3N_2$). A crucial parameter for the reactivity of such nitrides is the specific surface area thereof. The specific surface area here means the surface area of the material per unit weight. The specific surface area can be determined, for example, by gas adsorption (BET analysis).

The specific surface area of the silicon nitride is greater or equal than 5 m²/g and less or equal than 100 m²/g. According to at least one embodiment, the specific surface area at least of the silicon nitride is selected from the range from 10 m²/g to 30 m²/g, for example, 11 m²/g. More particularly, the specific surface area of silicon nitride is selected from a range from 10 to 15 m²/g. According to at least one embodiment, the specific surface area of aluminum nitride is selected from a range from 1 to 25 m²/g, especially 1 to 15 m²/g, for example, 3 m²/g. The more reactive the nitride(s), for example, silicon nitride, used is/are, the lower the synthesis temperature that can be chosen and the more finely divided the precursor material produced will be. In the case of an excessively high specific surface area, for example, of greater than 100 m²/g, there is the risk that the resulting pulverulent precursor materials will sinter excessively. Moreover, there is the risk of oxidic contamination as a result of the increased reactivity of the surface. The same applies to AlN from a specific surface area of greater than 25 m²/g.

In contrast to a coarse-grained precursor material, a finely distributed and/or pulverulent precursor material means here that the precursor material has a low first grain size value $d_{50}$ and/or a low second grain size value $d_{90}$. More particularly, the first grain size value $d_{50}$ has a value of less or equal than 2 μm and/or the second grain size value $d_{90}$ has a value of less or equal than 3.5 μm.

According to at least one embodiment, in process step A), the reactants can be weighed in stoichiometric amounts. Alternatively, the reactants can also be weighed in non-stoichiometric amounts, in which case at least one reactant or starting substance can be weighed in excess, in order to compensate for any evaporation losses during the production. For example, reactants comprising alkaline earth metal components can be weighed in excess. According to at least one embodiment, in process step A), the reactants used are carbonates, oxides, nitrides, carbides, metals and/or halides.

In this case, alkaline earth metal compounds and/or alkali metal compounds may be selected from alloy, hydrides, silicides, nitrides, halides, oxides, amides, amines, carbonates, metals and mixtures of these compounds and/or metals.

Preference is given to using calcium nitride, strontium carbonate and/or strontium nitride.

A silicon compound may be selected from silicon nitrides, alkaline earth metal silicides, silicon diimides, silicon hydrides, silicon oxide, silicon or mixtures of these compounds and/or of silicon. Preference is given to using silicon nitride, which is stable, readily available and inexpensive.

An aluminum compound may be selected from alloys, oxides, nitrides, metals and mixtures of these compounds and/or metals. Preference is given to using aluminum nitride, which is stable, readily available and inexpensive.

Compounds from the group of the lanthanoids, for example, compounds of europium, may be selected oxides, nitrides, halides, hydrides, metals or mixtures of these compounds and/or metals. Preference is given to using europium oxide, which is stable, readily available and inexpensive.

The bulk density of the reactants is a measure of the particle size of the resulting precursor material. In process step A), it should especially be ensured that the bulk density of the reactants is low. The more compressed the pulverulent mixture of the reactants in process step A) is, the more coarse-grained the resulting pulverulent precursor material will be. A low bulk density, in contrast, leads to a finely distributed precursor material. The bulk density can be influenced by sieving.

According to at least one embodiment, the silicon nitride in process step A) is semicrystalline or crystalline. It is thus possible to produce a pulverulent, finely divided precursor material. The crystallinity of the nitride affects the particle size or grain size or grain size value of the pulverulent precursor material.

According to at least one embodiment, a flux is additionally added in process step A). Alternatively, it is also possible to dispense with a flux in process step A). The flux can be used for the improvement of crystallinity and for promotion of crystal growth of the pulverulent precursor material. Secondly, the addition of the flux can lower the reaction temperature or calcination temperature. The reactants can be homogenized with the flux. Alternatively or additionally, the flux can also be added to the precursor material after the first calcination. The homogenization can be effected, for example, in a mortar mill, a ball mill, a turbulent mixer or a plowshare mixer, or by means of other suitable methods.

In the process, process step B) can be conducted at least once. More particularly, process step B) can be conducted once to five times, especially once to three times, for example, twice. The number of calcinations with subsequent grinding and optionally sieving in each case can affect the particle size or grain size or grain size value of the resulting precursor material. After the last calcination conducted, the mixture is ground and sieved.

In the process, the calcining in process step B) is conducted at a temperature of less or equal than 1550° C. According to at least one embodiment, process step B) is conducted at a temperature of 1200 to 1550° C., especially 1200 to 1500° C., for example, 1450° C. The selection of the temperature can affect the grain size or grain size value of the resulting pulverulent precursor material. The temperature refers here to the maximum temperature or the maximum synthesis temperature in process step B). The synthesis temperature chosen in this process is lower than those temperatures in conventional processes. The use of lower temperatures in process step B) leads to improved sintering capacity when the pulverulent precursor material is processed further. Frequently, low synthesis temperatures in the case of nitridic precursor materials or luminophores lead to formation of secondary phases. Through suitable choice of reactive reactants, in spite of a low synthesis temperature, it is possible to avoid the formation of secondary phases and obtain a finely distributed precursor material.

According to at least one embodiment, a hold time selected from the range from one minute to 24 hours is observed during the calcining in process step B). More particularly, the hold time is selected from the range of one hour to eight hours, for example, from the range of one hour to four hours, for example, two hours. "Hold time" is understood to mean the time during which the maximum temperature is maintained. Together with the heating and cooling time, the hold time gives the total calcining time. The hold time can likewise affect the particle size of the resulting pulverulent precursor material.

A further parameter for affecting the particle size of the resulting pulverulent precursor material is the heating and cooling ramps. These may be selected, for example, according to the furnace type. One furnace type is, for example, a tubular furnace, a chamber furnace or a push-through furnace.

The calcination can be effected in a crucible, for example, made from tungsten, molybdenum, corundum, alumina, graphite or boron nitride. This crucible may have a lining, for example, of molybdenum, or a lining of sapphire. The calcining can be effected in a gas-tight furnace under a reducing atmosphere and/or inert gas, for example, in hydrogen, ammonia, argon, nitrogen or mixtures thereof. The atmosphere may be flowing or stationary. It may additionally be advantageous for the quality of the resulting precursor material when elemental carbon in finely distributed form is present in the furnace space. Alternatively, it is possible to add carbon directly to the mixture of the reactants.

Multiple calcining of the reactants with or without an intermediate reprocessing operation, for example, grinding and/or sieving, can further improve the crystallinity or grain size distribution. Further advantages may be a lower defect density combined with improved optical properties of the resulting precursor material and/or a higher stability of the resulting precursor material.

According to at least one embodiment, process step B) is followed by a process step C). In process step C), the pulverulent precursor material can be washed in alkali and/or acid. The acid may be selected, for example, from a group comprising hydrochloric acids, sulfuric acid, nitric acid, hydrofluoric acid, organic acids and mixtures thereof. The alkali may be selected from a group comprising potassium hydroxide solution, sodium hydroxide solution and mixtures thereof. Such washes can increase the efficiency when a doped pulverulent precursor material is being produced. In addition, secondary phases, glass phases or other impurities can be removed thereby, and an improvement in the optical properties of the pulverulent precursor material can be achieved.

Further specified is a pulverulent precursor material produced by a process according to the details above.

According to at least one embodiment, the pulverulent precursor material is characterized by a first grain size value $d_{50}$ and/or a second grain size value $d_{90}$. More particularly, the pulverulent precursor material is produced by a process according to the above details. More particularly, the pulverulent precursor material has a first grain size value $d_{50}$ and a second grain size value $d_{90}$. The first grain size value $d_{50}$ may be less or equal than 2 μm and/or the second grain size value $d_{90}$ may be less or equal than 3.5 μm. The first grain size value $d_{50}$ is understood hereinafter, unless stated otherwise, to mean the $d_{50}$ value which is defined in such a way that 50% of the material based on the proportion by volume is below and/or 50% of the material based on the proportion by volume is above this size or this diameter. The second grain size value $d_{90}$ is defined here, unless stated otherwise, in such a way that 90% of the material based on the proportion by volume is below and/or 10% of the material based on the proportion by volume is above this size or this diameter. The term grain size or grain size value in this connection shall encompass both the primary grain size of a single grain and the agglomerated grain size. The first and second grain size value can be determined by means of laser diffraction. The particle size can be described by the $d_{50}$ and/or $d_{90}$ value.

According to at least one embodiment, the first grain size value $d_{50}$ has a value of 1+/−0.3 μm. Alternatively or additionally, the second grain size value $d_{90}$ may have a value of 3+/−0.3 μm.

The process thus provides a particularly finely distributed pulverulent precursor material having a very small first grain size value $d_{50}$ and also a second grain size value $d_{90}$. The finely distributed pulverulent precursor material is suitable for use in optoelectronic components, for example, light-emitting diodes. This includes both the use of the precursor in the form of powder as pulverulent conversion material and the further processing of the precursor to give ceramic luminophore converters or the use thereof in optoelectronic components. The latter is accounted for particularly by the good sinterability of the finely distributed pulverulent precursor material.

Additionally specified is the use of the pulverulent precursor material for formation of at least one ceramic layer of an optoelectronic component. The optoelectronic component may comprise, for example, an LED.

According to at least one embodiment, the pulverulent precursor material forms a ceramic layer in an optoelectronic component, the ceramic layer being disposed in the beam path of the optoelectronic component having a semiconductor layer sequence.

According to this embodiment, the semiconductor materials that occur in the semiconductor layer sequence are unrestricted, provided that at least some are electroluminescent. Examples of compounds used are those composed of the elements selected from indium, gallium, aluminum, nitrogen, phosphorus, arsenic, oxygen, silicon, carbon and combinations thereof. However, it is also possible to use other elements and additives. The layer sequence having an active region may be based, for example, on nitride compound semiconductor materials. "Based on nitride compound semiconductor material" in the present connection means that the semiconductor layer sequence or at least a portion thereof includes or consists of a nitride compound semiconductor material, preferably $Al_nGa_mIn_{1-n-m}N$ with $0 \leq n \leq 1$, $0 \leq m \leq 1$ and $n+m \leq 1$. This material need not necessarily have a mathematically exact composition according to the above formula. Instead, it may, for example, have one or more dopants and additional constituents. For the sake of simplicity, however, the above formula includes only the essential constituents of the crystal lattice (Al,Ga,In,N), even though they may be partly replaced and/or supplemented by small amounts of further substances.

The semiconductor layer sequence may have, as active region, for example, a conventional pn junction, a double heterostructure, a single quantum well structure (SQW structure) or a multiple quantum well structure (MQW structure). The semiconductor layer sequence may, as well as the active region, comprise further functional layers and functional regions, for instance p- or n-doped charge carrier transport layers, i.e., electron or hole transport layers, p- or n-doped confinement or cladding layers, buffer layers and/or electrodes, and combinations thereof. Such structures relating to the active region or the further functional layers and regions are known to those skilled in the art, especially in terms of composition, function and structure, and will therefore not be elucidated in detail here.

The pulverulent precursor material may form the entirety of the ceramic layer. Alternatively, further additions not including the pulverulent precursor material may be incorporated into the ceramic layer. The pulverulent precursor material may be processed further to give a ceramic or a ceramic layer. The ceramic processing can be effected, for example, by spark plasma sintering (SPS) or tape casting.

According to at least one embodiment, the ceramic layer is used as a wavelength conversion layer. The wavelength conversion layer may be present in a light-emitting diode, for example, a full conversion light-emitting diode. "Full conversion" here and hereinafter means that the luminophore in the form of a powder or ceramic layer is converted the radiation emitted by a semiconductor layer sequence, referred to here as primary radiation, completely to a radiation of altered wavelength, referred to here as secondary radiation. Alternatively, the ceramic layer or the luminophore in powder form can convert the primary radiation only partly to a secondary radiation. "Partly" means here that both primary radiation and secondary radiation leave the light-emitting diode as overall emission. In the wavelength conversion layer, it is thus possible to use a pulverulent precursor material which is a luminophore precursor and has a low particle size and hence good sinterability. Use in a wavelength conversion layer can be effected in powder form or in the form of further-processed ceramic. In both cases, the wavelength conversion layer can be disposed in the beam path of the light-emitting diode and partly or fully convert a primary radiation emitted to a secondary radiation having a different wavelength, usually a longer wavelength.

The wavelength conversion layer can be produced by the customary ceramic production methods as specified in connection with the pulverulent precursor material. In order to achieve a small particle size or grain size or grain size value of the pulverulent precursor material, as required for the ceramic production process, and the resultant increase in sintering capacity, it would be necessary to grind coarse-grain powders to a comparatively high degree. One effect of this, however, is a poorer efficiency of the materials because of damage resulting from at least one grinding operation, for example, through production of splintered grains, breakup of individual grains or the like, and impurities which are introduced into the grinding material as a result of the long grinding process. One result of this is a low quantum efficiency. By virtue of the pulverulent precursor material being produced with reactive reactants, it is already sufficiently finely distributed that prolonged grinding processes can be avoided. Therefore, the pulverulent precursor material can be processed to give efficient ceramic wavelength conversion layers.

Alternatively, the pulverulent precursor material can be used without further processing to give a ceramic component as pulverulent conversion material in an optoelectronic component. For this purpose, the pulverulent precursor material can be processed in volume-encapsulated form. The pulverulent precursor material can be embedded here in a matrix material, for example, silicone or other suitable matrix materials. The pulverulent precursor material embedded in matrix material may take the form of an encapsulation, layer or film.

According to at least one embodiment, the wavelength conversion layer takes the form of a platelet, in which case the platelet is disposed directly on a main radiation side of the semiconductor layer sequence. The main radiation side refers here to a face of the semiconductor layer sequence arranged transverse to the growth direction of the semiconductor layer sequence. "Directly" here and hereinafter means that the wavelength conversion layer is in direct mechanical contact with the main radiation side. In this case, no further layers and/or elements are disposed between the wavelength conversion layer and the main radiation side.

According to at least one embodiment, the wavelength conversion layer converts the electromagnetic primary radiation emitted by the semiconductor layer sequence completely to an electromagnetic secondary radiation.

Alternatively, the wavelength conversion layer converts only a portion, for example, 70%, the electromagnetic primary radiation emitted by the semiconductor layer sequence to an electromagnetic secondary radiation.

According to one embodiment, the wavelength conversion layer is in direct contact with the radiation source. Thus, the conversion of the electromagnetic primary radiation to the electromagnetic secondary radiation can at least partly be effected close to the radiation source, for example, at a separation of ceramic layer and radiation source of less or equal than 200 μm, preferably less or equal than 50 μm (called "chip level conversion").

According to one embodiment, the wavelength conversion layer is at a defined distance from the radiation source (called "remote phosphor conversion").

According to one embodiment, the wavelength conversion layer is spaced apart from the radiation source. Thus, the conversion of the electromagnetic primary radiation to the electromagnetic secondary radiation can be effected at least partly at a great distance from the radiation source, for example, at a distance between the ceramic layer and the radiation source of greater or equal than 200 μm, preferably greater or equal than 750 μm, more preferably greater or equal than 900 μm (called "remote phosphor conversion").

Here and hereinafter, color data in relation to emitting luminophores or precursor materials refer to the respective spectral region of the electromagnetic radiation.

According to at least one embodiment, the precursor material emits in the red spectral region. The red-emitting precursor material may take the form of a powder or ceramic. The red-emitting precursor material may be disposed in the beam path of an optoelectronic component.

In addition, the optoelectronic component may have a layer that emits in the yellow spectral region. The yellow-emitting layer may be in powder form or be composed of a powder in a matrix material, for example, silicone, or take the form of a ceramic. The yellow-emitting layer may be disposed in the beam path of an optoelectronic component. More particularly, it is possible to use yttrium aluminum garnet (YAG) and/or lutetium aluminum garnet (LuAG) in a or as a yellow-emitting layer.

According to at least one embodiment, a red- and yellow-emitting layer is disposed in the beam path of the blue-emitting primary radiation in an optoelectronic component. In this case, the primary radiation is converted only partly by the red- and yellow-emitting layers, such that the overall emission of the optoelectronic component is perceived as warm white light by an outside observer.

According to at least one embodiment, building on the aforementioned embodiments, at least one additional luminophore or an additional precursor material or an additional luminophore ceramic is disposed in the beam path of the optoelectronic component. In principle, the additional luminophore or the additional precursor material or the additional luminophore ceramic may emit any wavelength from the visible spectral region, for example, in the blue or green spectral region. The overall emission of the optoelectronic component may be perceived as white light by an outside observer.

According to at least one embodiment, the pulverulent precursor material, for example, takes the form of a conversion layer in a potting material and is disposed in an optoelectronic component. The conversion layer is disposed in the beam path of the optoelectronic component having a semiconductor layer sequence.

BRIEF DESCRIPTION OF THE DRAWINGS

Further advantages and advantageous embodiments of the process, the pulverulent precursor material and the use thereof will become apparent from the inventive examples and figures which follow.

DETAILED DESCRIPTION OF ILLUSTRATIVE EMBODIMENTS

Specified hereinafter are comparative examples C1, C2 and C3 for production of a coarse-grained precursor material and inventive examples I1, I2 and I3 for production of finely divided pulverulent precursor materials.

COMPARATIVE EXAMPLE C1

Production of $CaAlSiN_3$:Eu 50 g of $Ca_3N_2$, 41 g of AlN, 47 g of $Si_3N_4$ (specific surface area about 11 m$^2$/g) and 5 g of $Eu_2O_3$ are weighed out and homogenized under a protective gas atmosphere. Subsequently, the reactant mixture is calcined in slightly compacted form under a reducing atmosphere in a tubular or chamber furnace at temperatures between 1550° C. and 1800° C. for several hours. This may be followed by further calcinations to adjust the grain size or the grain size value, likewise under a reducing atmosphere, between 1550° C. and 1800° C. After subsequent grinding and sieving of the calcined cake, the result is a coarse-grained luminophore having the general formula CaAlSiN$_3$:Eu. The coarse-grained luminophore illustrated in FIG. 1 and in table 1, after processing, has a first grain size value d$_{50}$ of 9.4 µm and a second grain size value d$_{90}$ of 15.8 µm.

COMPARATIVE EXAMPLE C2

Production of CaAlSiN$_3$:Eu 50 g of Ca$_3$N$_2$, 41 g of AlN, 47 g of amorphous Si$_3$N$_4$ (specific surface area about 110 m$^2$/g) and 5 g of Eu$_2$O$_3$ are weighed out and homogenized under a protective gas atmosphere. Subsequently, the reactant mixture is calcined in slightly compacted form under a reducing atmosphere in a tubular or chamber furnace at temperatures between 1300° C. and 1800° C., for example, at 1450° C., for several hours. This may be followed by further calcinations to adjust the grain size or the grain size value, likewise under a reducing atmosphere, between 1300° C. and 1800° C., for example, at 1450° C. After subsequent grinding and sieving of the calcined cake, the result is a coarse-grained luminophore (see table 1).

COMPARATIVE EXAMPLE C3

Figure 1:
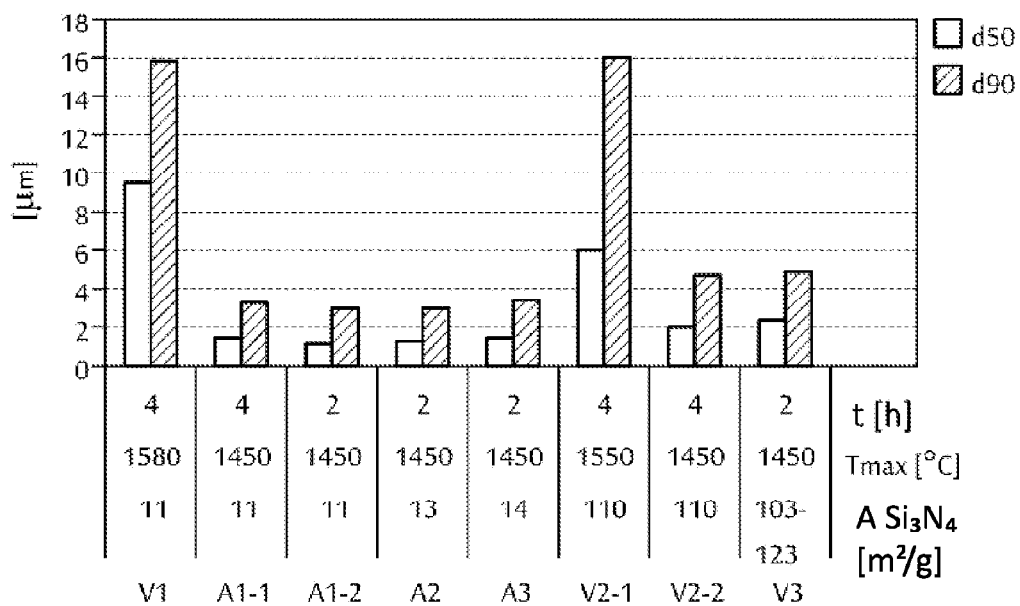
FIG. 1 shows a first grain size value $d_{50}$ and a second grain size value $d_{90}$ of the pulverulent precursor material of embodiments and of comparative examples.

Production of CaAlSiN$_3$:Eu 50 g of Ca$_3$N$_2$, 41 g of AlN, 47 g of amorphous Si$_3$N$_4$ (specific surface area about 103 to 123 m$^2$/g) and 5 g of Eu$_2$O$_3$ are weighed out and homogenized under a protective gas atmosphere. Subsequently, the reactant mixture is calcined in slightly compacted form under a reducing atmosphere in a tubular or chamber furnace at temperatures between 1300° C. and 1800° C., for example, at 1450° C., for several hours. This may be followed by further calcinations to adjust the grain size or the grain size value, likewise under a reducing atmosphere, between 1300° C. and 1800° C., for example, at 1450° C. After subsequent grinding and sieving of the calcined cake, the result is a coarse-grained luminophore. The coarse-grained luminophore has a first grain size value d$_{50}$ of 2.3 µm and a second grain size value d$_{90}$ of 4.9 µm (FIG. 1 and table 1).

INVENTIVE EXAMPLE I1

Production of CaAlSiN$_3$:Eu 82 g of Ca$_3$N$_2$, 68 g of AlN, 78 g of Si$_3$N$_4$ (specific surface area about 11 m$^2$/g) and 1 g of Eu$_2$O$_3$ are weighed out and homogenized under a protective gas atmosphere. Subsequently, the reactant mixture is calcined in slightly compacted form under a reducing atmosphere in a tubular or chamber furnace at temperatures between 1300° C. and 1550° C. for several hours. After subsequent grinding and sieving of the calcined cake, the result is a fine-grained and very reactive pulverulent precursor material. This precursor material can be used for ceramic materials. This pulverulent precursor material consists, as well as the CaAlSiN$_3$:Eu phase, of the CaSiN$_2$:Eu intermediate and as yet unreacted AlN. The latter are converted fully in the course of ceramic production to the desired CaAlSiN$_3$:Eu.

INVENTIVE EXAMPLE I2

Production of CaAlSiN$_3$:Eu 82 g of Ca$_3$N$_2$, 68 g of AlN, 78 g of Si$_3$N$_4$ (specific surface area about 13 m$^2$/g) and 1 g of Eu$_2$O$_3$ are weighed out and homogenized under a protective gas atmosphere. Subsequently, the reactant mixture is calcined in slightly compacted form under a reducing atmosphere in a tubular or chamber furnace at temperatures between 1300° C. and 1550° C. for several hours. After subsequent grinding and sieving of the calcined cake, the result is a fine-grained and reactive CaAlSiN$_3$:Eu. The pulverulent precursor material has a first grain size value d$_{50}$ of 1.2 µm and a second grain size value d$_{90}$ of 2.9 µm. X-ray diffraction (XRD) confirms the phase purity of the pulverulent precursor material.

INVENTIVE EXAMPLE I3

Production of CaAlSiN$_3$:Eu 82 g of Ca$_3$N$_2$, 68 g of AlN, 78 g of Si$_3$N$_4$ (specific surface area about 14 m$^2$/g) and 1 g of Eu$_2$O$_3$ are weighed out and homogenized under a protective gas atmosphere. Subsequently, the reactant mixture is calcined in slightly compacted form under a reducing atmosphere in a tubular or chamber furnace at temperatures between 1300° C. and 1550° C. for several hours. After subsequent grinding and sieving of the calcined cake, the result is a fine-grained and reactive CaAlSiN$_3$:Eu. The pulverulent precursor material has a first grain size value d$_{50}$ of 1.3 µm and a second grain size value d$_{90}$ of 3.3 µm. X-ray diffraction (XRD) confirms the phase purity of the pulverulent precursor material.

FIG. 1 shows, for the corresponding comparative examples C1, C2-1, C2-2 and C3 and the inventive examples I1-1, I1-2, I2 and I3, a graph of a first grain size value d$_{50}$ in µm and a second grain size value d$_{90}$ in µm at the corresponding hold time t in hours h, maximum temperature or maximum calcination temperature T$_{max}$ in ° C. and specific surface area A of the Si$_3$N$_4$ in m$^2$/g. Table 1 additionally shows the quantum efficiency Q.E. in % of the pulverulent precursor material. Comparative examples C2-1 and C2-2 were produced analogously to comparative example C2, with adjustment of the parameters such as the specific surface area A of Si$_3$N$_4$ in m$^2$/g, maximum calcination temperature T$_{max}$ in ° C. and/or maximum hold time t in h, according to table 1. The procedure was analogous in the case of inventive examples I1-1 and I1-2. Table 1 additionally shows the first grain size value d$_{50}$ in µm, the second grain size value d$_{90}$ in µm and the quantum efficiency Q.E. in % for the pulverulent precursor material according to one embodiment and of comparative examples. The Q.E. was determined in each case by powder tablet analysis.

TABLE 1

| | A in m$^2$/g | T$_{max}$ in ° C. | t in h | d$_{50}$ in µm | d$_{90}$ in µm | Q.E. in % |
|---|---|---|---|---|---|---|
| C1 | 11 | 1580 | 4 | 9.4 | 15.8 | 83 |
| C2-1 | 110 | 1550 | 4 | 5.8 | 16.1 | 69 |
| C2-2 | 110 | 1450 | 4 | 2.0 | 4.6 | 67 |
| C3 | 103 to 123 | 1450 | 2 | 2.3 | 4.9 | 51 |
| I1-1 | 11 | 1450 | 4 | 1.4 | 3.3 | 77 |
| I1-2 | 11 | 1450 | 2 | 1.1 | 3.0 | 68 |
| I2 | 13 | 1450 | 2 | 1.2 | 2.9 | 70 |
| I3 | 14 | 1450 | 2 | 1.3 | 3.3 | 70 |

It can be inferred from table 1 that, when using an Si$_3$N$_4$ having a specific surface area of greater or equal than 5 m$^2$/g and less or equal than 100 m$^2$/g as reactant and a calcining temperature in process step B) of less or equal than 1550° C., it is possible to produce a finely distributed pulverulent precursor material having a very small first grain size value $d_{50}$ and/or a second grain size value $d_{90}$ with correspondingly high quantum efficiency. The hold time is between 2 and 4 hours.

Table 2 below shows the influence of the specific surface area AA of aluminum nitride AlN in m²/g on the first grain size value $d_{50}$ and second grain size value $d_{90}$ of the finely distributed pulverulent precursor material. The specific surface area of about 11 m²/g of silicon nitride was kept constant in all the experiments. It is apparent from table 2 that a small specific surface area of aluminum nitride, especially a specific surface area of ≤3.6 m²/g, leads to small grain sizes or grain size values. For example, a pulverulent precursor material which has been produced with aluminum nitride having a specific surface area of 3.1 to 3.6 m²/g exhibits a first grain size value $d_{50}$ of 1.1 μm and a second grain size value $d_{90}$ of 3.9 μm.

TABLE 2

| AA in m²/g | $T_{max}$ in ° C. | t in h | $d_{50}$ in μm | $d_{90}$ in μm |
|---|---|---|---|---|
| 3.1 to 3.6 | 1450 | 2 | 1.1 | 3.0 |
| >115 | 1450 | 2 | 4.3 | 17.8 |
| 2.3 to 2.9 | 1450 | 2 | 1.4 | 4.2 |

It has been shown that it is possible via the specific surface area of the nitrides (reactants) and the suitably selected temperature to selectively produce a pulverulent precursor material and to control its sintering properties and its grain size. It is thus possible to influence the packing density in tape casting, for example, via the particle size. In general, precursors having a high $d_{90}$ value or second grain size value are difficult to process or improcessible in ceramic production or have to be reprocessed in complex grinding operations which lead to efficiency losses and impurities.

Figure 2:
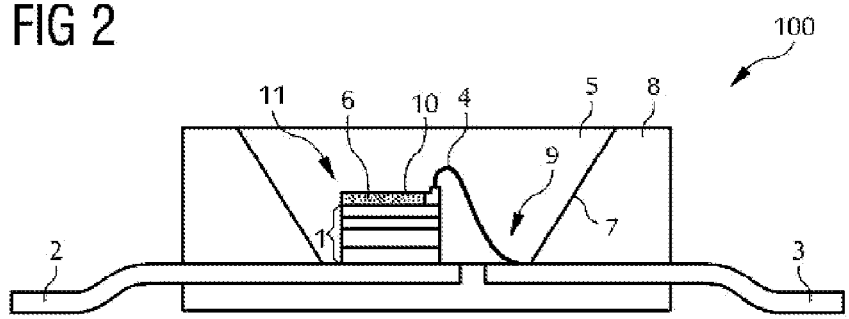
FIG. 2 shows a schematic side view of an optoelectronic component according to one embodiment.

FIG. 2 shows a schematic side view of an optoelectronic component 100 using the working example of a light-emitting diode (LED). The optoelectronic component 100 has a layer sequence 1 with an active region (not shown explicitly), a first electrical connection 2, a second electrical connection 3, a bonding wire 4, an encapsulation 5, a housing wall 7, a housing 8, a recess 9, a precursor material 6 for formation of a ceramic layer 11 or wavelength conversion layer 11 and a matrix material 10. The layer sequence 1 having an active region comprising the wavelength conversion layer 11 is disposed within the optoelectronic component, the encapsulation 5 and/or the recess 9. The first and second electrical connections 2, 3 are disposed beneath the layer sequence 1 having an active region. There is indirect and/or direct electrical and/or mechanical contact between the layer sequence 1 having an active region and the bonding wire 4, and between the layer sequence 1 having an active region and the first and/or second electrical connection(s) 2, 3.

In addition, the layer sequence 1 having an active region may be disposed on a carrier (not shown here). A carrier may, for example, be a printed circuit board (PCB), a ceramic substrate, another circuit board or a metal sheet, for example, aluminum sheet.

Alternatively, a carrier-free arrangement of the layer sequence 1 is possible in the case of what are called thin-film chips.

The active region is suitable for emission of electromagnetic primary radiation in an emission direction. The layer sequence 1 having an active region may be based, for example, on nitride compound semiconductor material. Nitride compound semiconductor material emits particularly electromagnetic primary radiation in the blue and/or ultraviolet spectral region. More particularly, InGaN can be used as nitride compound semiconductor material having electromagnetic primary radiation having a wavelength of 460 nm.

The wavelength conversion layer 11 is disposed in the beam path of the electromagnetic primary radiation. The matrix material 10 is, for example, polymeric or ceramic material. In this case, the wavelength conversion layer 11 is disposed in direct mechanical and/or electrical contact on the layer sequence 1 having an active region.

Alternatively, further layers and materials, for example, the encapsulation, may be disposed between the wavelength conversion layer and the layer sequence 1 (not shown here).

Alternatively, the wavelength conversion layer 11 may be disposed indirectly or directly on the housing wall 7 of a housing 8 (not shown here).

Alternatively, it is possible that the precursor material is embedded in a potting compound (not shown here) and takes the form of an encapsulation 5 together with a further material, for example, a diffuser, 10.

The wavelength conversion layer 11 at least partly converts the electromagnetic primary radiation to an electromagnetic secondary radiation. For example, the electromagnetic primary radiation emits in the blue spectral region of the electromagnetic radiation, with conversion of at least some of this electromagnetic primary radiation by the wavelength conversion layer 11 to an electromagnetic secondary radiation in the red and/or green spectral region and/or combinations thereof. The total radiation emitted from the optoelectronic component is a superimposition of blue-emitting primary radiation and red- and green-emitting secondary radiation, the overall emission visible to the outside observer being white light.

The wavelength conversion layer 11 may take the form of a ceramic or powder and may convert the electromagnetic primary radiation fully to electromagnetic secondary radiation. In this case, the electromagnetic secondary radiation is in the red spectral region.

According to at least one embodiment, the red-emitting wavelength conversion layer 11 takes the form of a ceramic and is disposed in an optoelectronic component additionally with a yellow- and/or green-emitting luminophore in the form of a powder. More particularly, the optoelectronic component has an overall emission which is perceived as white light by an outside observer.

According to at least one embodiment, the red-emitting wavelength conversion layer 11 takes the form of a ceramic and is disposed in an optoelectronic component additionally or alternatively with a yellow- and/or green-emitting luminophore in the form of a ceramic. More particularly, the optoelectronic component has an overall emission which is perceived as white light by an outside observer.

According to at least one embodiment, the red-emitting wavelength conversion layer 11 takes the form of a powder and is disposed in an optoelectronic component additionally with a yellow- and/or green-emitting luminophore in the form of a ceramic. More particularly, the optoelectronic component has an overall emission which is perceived as white light by an outside observer.

According to at least one embodiment, the red-emitting wavelength conversion layer 11 takes the form of a powder and is disposed in an optoelectronic component additionally with at least one yellow- and/or green-emitting luminophore in the form of a powder. More particularly, the optoelectronic component has an overall emission which is perceived as white light by an outside observer.

According to at least one embodiment, the primary radiation has a wavelength from the UV spectral region. The wavelength conversion layer 11 may take the form of a ceramic or powder and be disposed in an optoelectronic component additionally with a yellow- and/or green-emitting luminophore in the form of a ceramic or powder and with a blue-emitting luminophore in the form of a ceramic or powder. More particularly, the optoelectronic component has an overall emission which is perceived as white light by an outside observer.

The invention is not restricted by the description with reference to the working examples; instead, the invention encompasses every new feature and every combination of features, which especially includes every combination of features in the claims, even if this feature or this combination itself is not specified explicitly in the claims or working examples.

The invention claimed is:

1. A process for producing a pulverulent precursor material of the general composition I or II or III or IV:

I: $(Ca_ySr_{1-y})AlSiN_3:X1$
   II: $(Ca_bSr_aLi_{1-a-b})AlSi(N_{1-c}F_c)_3:X2$
   III: $Z_{5-\delta}Al_{4-2\delta}Si_{8+2\delta}N_{18}:X3$
   IV: $(Z_{1-d}Li_d)_{5-\delta}Al_{4-2\delta}Si_{8+2\delta}(N_{1-x}F_x):X4$ wherein X1 and X2 and X3 and X4 are each one activator or a combination of two or more activators;
   wherein the activator is selected from the group consisting of lanthanoids, $Mn^{2+}$, $Mn^{4+}$, and combinations thereof;
   wherein Z is selected from the group consisting of Ca, Sr, Mg, and combinations thereof;
   wherein: $0 \leq y \leq 1$ and $0 \leq a < 1$ and $0 \leq b < 1$ and $0 < c \leq 1$ and $|\delta| \leq 0.5$ and $0 \leq x < 1$ and $0 \leq d < 1$;
   the process comprising:
   producing a pulverulent mixture of reactants, wherein the reactants comprise ions of the compositions I and/or II and/or III and/or IV, wherein a silicon nitride having a specific surface area of greater or equal than 5 $m^2/g$ and less or equal than 100 $m^2/g$ is selected as a reactant;
   calcining the mixture under a protective gas atmosphere and at a temperature less than or equal to 1550° C.; and
   grinding the calcined mixture,
   wherein the pulverulent precursor material of the general composition I or II or III or IV is produced, wherein the pulverulent precursor material has a first grain size value $d_{50}$ and a second grain size value $d_{90}$, and wherein the first grain size value $d_{50}$ is less or equal than 2 μm and the second grain size value $d_{90}$ is less or equal than 3.5 μm.

2. The process according to claim 1, wherein the calcining is conducted at a temperature between 1200° C. and 1450° C.

3. The process according to claim 1, wherein the calcining is conducted at a temperature between 1200° C. and 1550° C.

4. The process according to claim 1, wherein the silicon nitride has a specific surface area in a range from 10 $m^2/g$ to 30 $m^2/g$.

5. The process according to claim 1, wherein AlN is a reactant of the mixture of reactants, wherein AlN has a specific surface area of 1 to 25 $m^2/g$.

6. The process according to claim 1, wherein reactants used in producing the pulverulent mixture of reactants are selected from the group consisting of carbonates, oxides, nitrides, carbides, metals and halides and combinations thereof.

7. The process according to claim 1, wherein the silicon nitride is semicrystalline or crystalline.

8. The process according to claim 1, wherein the calcining is conducted from one to five times.

9. The process according to claim 1, wherein the calcining includes a hold time between 1 minute and 24 hours.

10. The process according to claim 1, further comprising washing the pulverulent precursor material in alkali and/or acid after the calcining.

11. A pulverulent precursor material produced by a process according to claim 1.

12. The pulverulent precursor material according to claim 11, wherein the pulverulent precursor material has the first grain size value $d_{50}$ and the second grain size value $d_{90}$, and wherein the first grain size value $d_{50}$ has a value of 1±0.3 μm and the second grain size value $d_{90}$ has a value of 3±0.3 μm.

* * * * *

UNITED STATES PATENT AND TRADEMARK OFFICE
CERTIFICATE OF CORRECTION

PATENT NO. : 9,534,169 B2  
APPLICATION NO. : 14/888038  
DATED : January 3, 2017  
INVENTOR(S) : Pohl-Klein et al.

Page 1 of 1

It is certified that error appears in the above-identified patent and that said Letters Patent is hereby corrected as shown below:

In the Claims

In Column 13, Line 24, Claim 1, delete "IV: $(Z_{1-d}Li_d)_{5-\delta}Al_{4-2\delta}Si_{8+2\delta}(N_{1-x}F_x{:}X4$" and insert --IV: $(Z_{1-d}Li_d)_{5-\delta}Al_{4-2\delta}Si_{8+2\delta}(N_{1-x}F_x)_{18}{:}X4$--.

Signed and Sealed this  
Twenty-seventh Day of June, 2017

Joseph Matal  
*Performing the Functions and Duties of the*  
*Under Secretary of Commerce for Intellectual Property and*  
*Director of the United States Patent and Trademark Office*